US009251065B2

(12) United States Patent
Rolandi et al.

(10) Patent No.: US 9,251,065 B2
(45) Date of Patent: *Feb. 2, 2016

(54) EXECUTE-IN-PLACE MODE CONFIGURATION FOR SERIAL NON-VOLATILE MEMORY

(71) Applicant: MICRON TECHNOLOGY, INC., Boise, ID (US)

(72) Inventors: Paolo Rolandi, Voghera (IT); Sandra Lospalluti, Catania (IT); Raffaele Bufano, Tremestieri Etneo (IT); Stefano Andreoli, Milan (IT); Tommaso Zerilli, Tremestieri Etneo (IT)

(73) Assignee: Micro Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/617,736

(22) Filed: Feb. 9, 2015

(65) Prior Publication Data
US 2015/0220431 A1   Aug. 6, 2015

Related U.S. Application Data

(63) Continuation of application No. 14/149,624, filed on Jan. 7, 2014, now Pat. No. 8,954,660, which is a continuation of application No. 13/143,078, filed as application No. PCT/IB2008/055582 on Dec. 30, 2008, now Pat. No. 8,635,398.

(51) Int. Cl.
G06F 12/00 (2006.01)
G06F 12/02 (2006.01)
G11C 16/26 (2006.01)
G06F 9/30 (2006.01)
G06F 9/445 (2006.01)

(52) U.S. Cl.
CPC ........ *G06F 12/0246* (2013.01); *G06F 9/30098* (2013.01); *G11C 16/26* (2013.01); *G06F 9/44573* (2013.01); *G06F 2212/72* (2013.01); *G06F 2212/7206* (2013.01); *G11C 2216/30* (2013.01)

(58) Field of Classification Search
CPC ............ G06F 12/0246; G06F 2212/72; G06F 9/44573
See application file for complete search history.

(56) References Cited

U.S. PATENT DOCUMENTS

2004/0193864 A1* 9/2004 Tsai et al. .......................... 713/1
2006/0227610 A1* 10/2006 Pascucci et al. .......... 365/185.17

* cited by examiner

Primary Examiner — Shawn X Gu
(74) Attorney, Agent, or Firm — Knobbe Martens Olson & Bear LLP

(57) ABSTRACT

Example embodiments for configuring a serial non-volatile memory device for an execute-in-place mode may comprise a non-volatile configuration register to store an execute-in-place mode value that may be read at least in part in response to power being applied to the memory device.

20 Claims, 9 Drawing Sheets

EXECUTE-IN-PLACE MODE CONFIGURATION FOR SERIAL NON-VOLATILE MEMORY

RELATED APPLICATIONS

This application is a continuation application of U.S. patent application Ser. No. 14/149,624, filed Jan. 7, 2014, now U.S. Pat. No. 8,954,660, which is a continuation application of U.S. patent application Ser. No. 13/143,078, filed Jan. 11, 2012, now U.S. Pat. No. 8,635,398, which is a 35 U.S.C. §371 national phase filing of and claims the benefit of priority to PCT/IB2008/055582, filed Dec. 30, 2008, titled Execute-In-Place Mode Configuration for Serial Non-Volatile Memory, the entireties of which are hereby incorporated by reference herein.

BACKGROUND

Subject matter disclosed herein may relate to non-volatile memory devices, and may relate more particularly to configuring serial non-volatile memory devices for an execute-in-place mode.

Non-volatile memory devices, including flash memory devices, may be found in a wide range of electronic devices, in particular, flash memory devices may be used in computers, digital cameras, cellular telephones, personal digital assistants, etc. For many applications, flash memory devices may store instructions to be executed on a processor, and in at least some of these applications, the processor may fetch instructions from the flash memory devices, such as, for example, in execute-in-place (XiP) implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
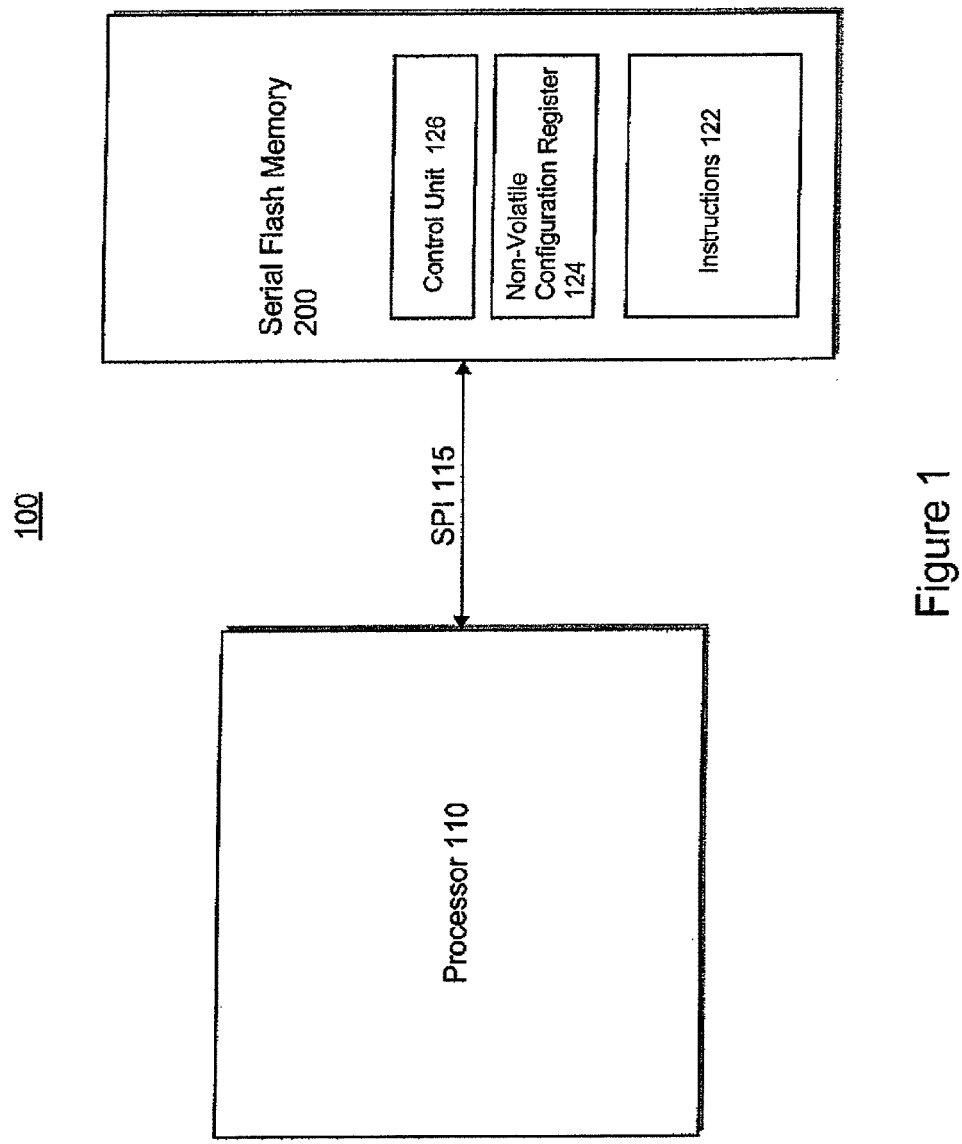
FIG. 1 is a block diagram of an example embodiment of a computing platform.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments, in general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C1 is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

As discussed above, for many applications, flash memory devices may store instructions to be executed on a processor, and in at least some of these applications, the processor may fetch instructions from the flash memory devices, such as, for example, in execute-in-place (XiP) implementations. As used herein, the term "execute-in-place", along with its abbreviation "XiP", relates to a processor fetching instructions from a long term storage device, such as, for example, a flash memory, rather than fetching instructions from an intermediate storage, such as, for example, a dynamic random access memory (DRAM).

Flash memory may be characterized at least in part by the ability to be electrically erasable and programmable, and may be utilized in a very wide range of electronic device types, including, but not limited to, digital cameras, cellular telephones, personal digital assistants, portable navigation devices, portable music players, notebook computers, desktop computers, etc., to name but a few examples. Also, flash memory devices may comprise either parallel data interfaces or serial interfaces. Parallel interfaces, in at least some instances, may allow for relatively good data throughput due at least in part to increased numbers of input/output terminals. Serial interfaces, on the other hand, may provide reduced costs due at least in part to reduced numbers of input/output terminals. As system designers seek to provide increased performance while reducing costs, it may be advantageous to enhance the throughput of serial flash memory devices. For one or more embodiments, one or more execute-in-place modes for read commands may be provided, as discussed below. Although example embodiments described herein discuss flash memory devices, the scope of claimed subject matter is not limited in this respect and other embodiment may utilize other types of non-volatile memory devices. For example, one or more embodiments may include serial read-only memory (ROM), serial phase change memory (PCM), etc.

FIG. 1 is a block diagram of an example embodiment of a computing platform 100, comprising a processor 110 and a serial flash memory 200. Memory 200 for this example is coupled to processor 110 by way of a serial peripheral interface (SPI) 115, as discussed more fully below. For one or more embodiments, Serial Flash Memory 200 may comprise a control unit 126 and a configuration register 124. For one or more embodiments, configuration register 124 may comprise a non-volatile register. Also for one or more embodiments, non-volatile configuration register 124 may comprise one or more flash memory cells, although the scope of claimed subject matter is not limited in this respect. Further, memory 200 may store instructions 122 that may comprise code for any of a wide range of possible operating systems and/or applications. The instructions may be executed by processor 110. Note that for this example, processor 110 and memory 200 are configured as an execute-in-place (XiP) type implementation, where processor 110 may fetch instructions directly from a long-term storage device.

For one or more embodiments, control unit 126 may receive one or more signals from processor 110 and may generate one or more internal control signals to perform any of a number of operations, including data read operations, by which processor 110 may access instructions 122, for example. As used herein, the term "control unit" is meant to include any circuitry or logic involved in the management and/or execution of command sequences as they relate to flash memory devices.

The term "computing platform" as used herein refers to a system or a device that includes the ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For the example embodiments described herein, computing platform 100 may comprise a cellular telephone, although again, the scope of claimed subject matter is not so limited.

Figure 2B:
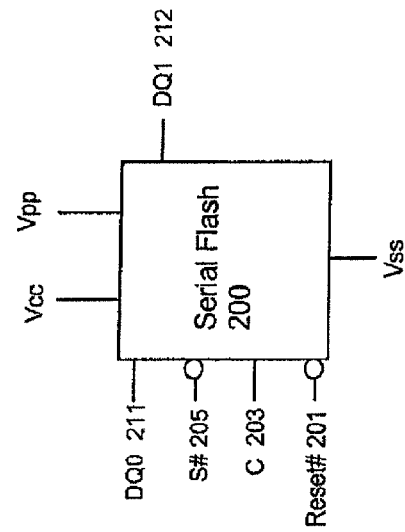
FIG. 2b is a block diagram depicting an example embodiment of a serial flash memory device configured for dual input/output operation.
Figure 2A:
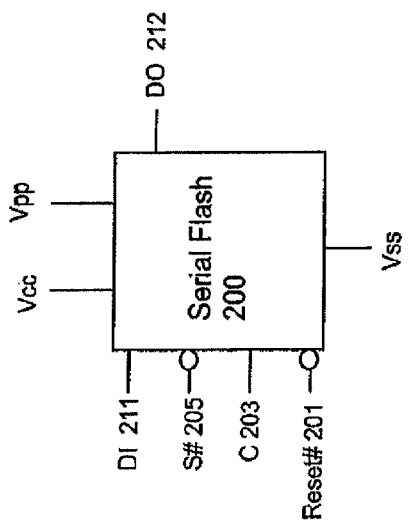
FIG. 2a is a block diagram depicting an example embodiment of a serial flash memory device configured for single input and single output operation.
Figure 2C:
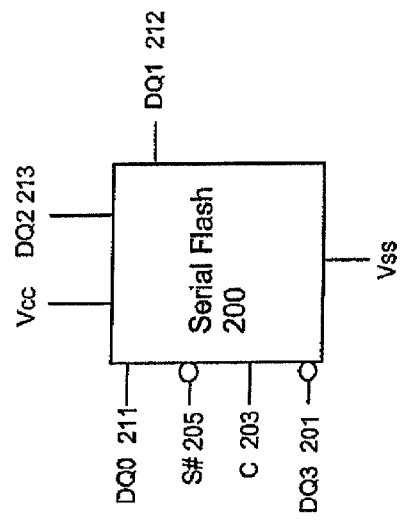
FIG. 2c is a block diagram depicting an example embodiment of a serial flash memory device configured for quad input/output operation.

As mentioned above, for an embodiment, processor 110 may be coupled to serial flash memory 200 by way of a serial peripheral interface 115. The term "serial peripheral interface" for an embodiment refers to a de facto standard for serial communications between components in some electronic devices. SPI 115 may comprise a number of signals, as will be discussed more fully below, including a clock signal, input/output signals, and a slave select signal. FIGS. 2a through 2c below, describe several modes of operation for SPI 115 as it relates to serial flash memory device 200, including single input/output interface operations, dual input/output interface operations, and quad input/output interface operations.

FIG. 2a is a block diagram depicting an example embodiment of a serial flash memory device configured for single input/output (I/O) interface operations. Serial flash memory 200 may comprise a terminal Vcc to be coupled to a power source, and a terminal Vpp that may also be coupled to a power source, but which may also have other purposes in other configurations, as discussed below. Memory 200 may also include a terminal Vss that may provide an electrical connection to a ground signal. Serial flash memory 200 for this example may also comprise a data input terminal DI 211 and a data output terminal DO 212, as well as a Reset# signal terminal 201, a clock C signal terminal 203, and a Slave (S#) signal 205. If serial flash memory 200 is operating in the single input, single output mode, information may be shifted into the memory via DI 211, and may be shifted out of the memory via DO 212.

For an embodiment, an SPI command sequence may begin with a one byte command code that may be initiated with a falling edge of S#205. The 8 bit command code may be latched into DI 211, most significant bit (MSB) first, for an example embodiment, on a rising edge of C 203. Depending on the particular command code, the command code may be followed by additional address bytes, followed by dummy bytes and/or data bytes. The total number of input cycles for a command depends on the particular command code. Further, for this example, address bits may be latched at DI 211 on the rising edge of C. Also, cycles during which undefined (don't care) data are shifted onto DI 211 may be referred to as dummy clock cycles. Also, for an embodiment, as with the command code, the address, dummy, and data bytes are latched at DI 211 most significant bit first, for this example, although the scope of claimed subject matter is not limited in this respect.

Further, for an embodiment, depending upon the particular command code, data bytes may either be latched as input data at DI 211 or transmitted as output data from DO 212. For cycles that input data through DI 211, DO 212 may be set to a high impedance (Z) state.

Also for an embodiment, a rising edge of S#205 may signal an end to the command sequence and may initiate a resetting of the SPI interface. A de-assertion of S# may also result in a termination of the output data stream for read operations, may bring DO 212 to a high Z state, and may also result in memory 200 entering a standby mode. Of course, these are merely examples of the possible results of a de-assertion of S#205, and the scope of claimed subject matter is not limited in these respects.

FIG. 2b is a block diagram depicting an example embodiment of serial flash memory device 200 configured as a dual input/output interface. During a dual I/O command sequence, DI 211 and DO 212 may be referred to as DQ0 211 and DQ1 212, and may be utilized as either input or output terminals, depending on the state of the command sequence. Information may be latched into DQ0 211 and DQ1 212 on the rising edge of C 203, and information may be shifted out of terminals DQ0 211 and DQ1 212 on the falling edge of C 203.

A Dual Input Fast Program (DIFP) command, for an embodiment, makes it possible to program up to 256 bytes using terminals 211 and 212 concurrently as data input terminals. At the beginning of the command sequence, DQ0 211 may be used to latch the command code and address information.

A Dual Output Fast Read (DOFR) command, for an embodiment, makes it possible to read a data byte using two terminals DQ1 212 and DQ0 211 concurrently. Transmitting the information over two lines instead of one may effectively double the data transfer throughput compared to the Fast Read Data Bytes (Fast Read) command. DQ0 211 may be used to latch the command code and address information, for an embodiment.

Also, for an embodiment, a Dual I/O Fast Read (DIOFR) command may share many similarities with the DOFR command, discussed above, but it may also allow the input of the address using DQ0 211 and DQ1 212 concurrently as data output terminals. As with the commands discussed above, DQ0 211 may be used to latch the command code and address information, FIG. 2c is a block diagram depicting an example embodiment of serial flash memory device 200 configured for quad input/output operations. For Quad I/O command sequences, for an embodiment, DQ0 211 and DQ1 212 terminals may be used as input and output terminals. Information may be latched on the rising edge of C 203, and information may be shifted out onto the terminals on the falling edge of C 203. During a quad I/O command sequence, at least in part in response to receiving the command code, the Vpp and Reset#201 terminals may be re-purposed as input/output terminals DQ2 213 and DQ3 201, respectively.

For an embodiment, a Quad I/O Fast Read Data Bytes (QIOFR) command may allow reading information using four pins DQ3 201, DQ2 213, DQ1 212, and DQ0 211 concurrently as data output terminals. Transmitting data on four terminals instead of one may greatly improve throughput compared to the Fast Read command, noted above. For the QIOFR command, it may also be possible to receive the address over the same four terminals. As with other commands discussed above, DQ0 211 may be used to receive the command code.

Various configurations for serial flash memory 200 among those discussed above, along with various examples of command sequences including execute-in-place (XiP) read operations, are revisited below. Also, it should be noted that the operations, command sequences, and serial flash memory device configurations described herein are merely examples, and the scope of claimed subject matter is not limited in this respect. As used herein, the term "execute-in-place mode" or "XiP mode" is meant to include any mode of operation for a serial flash memory device that configures that memory device for improved performance for read operations initiated by a processor. For one or more embodiments described herein, the improved performance may comprise performing read operations without a command code being received by the memory device from the processor.

Figure 3:
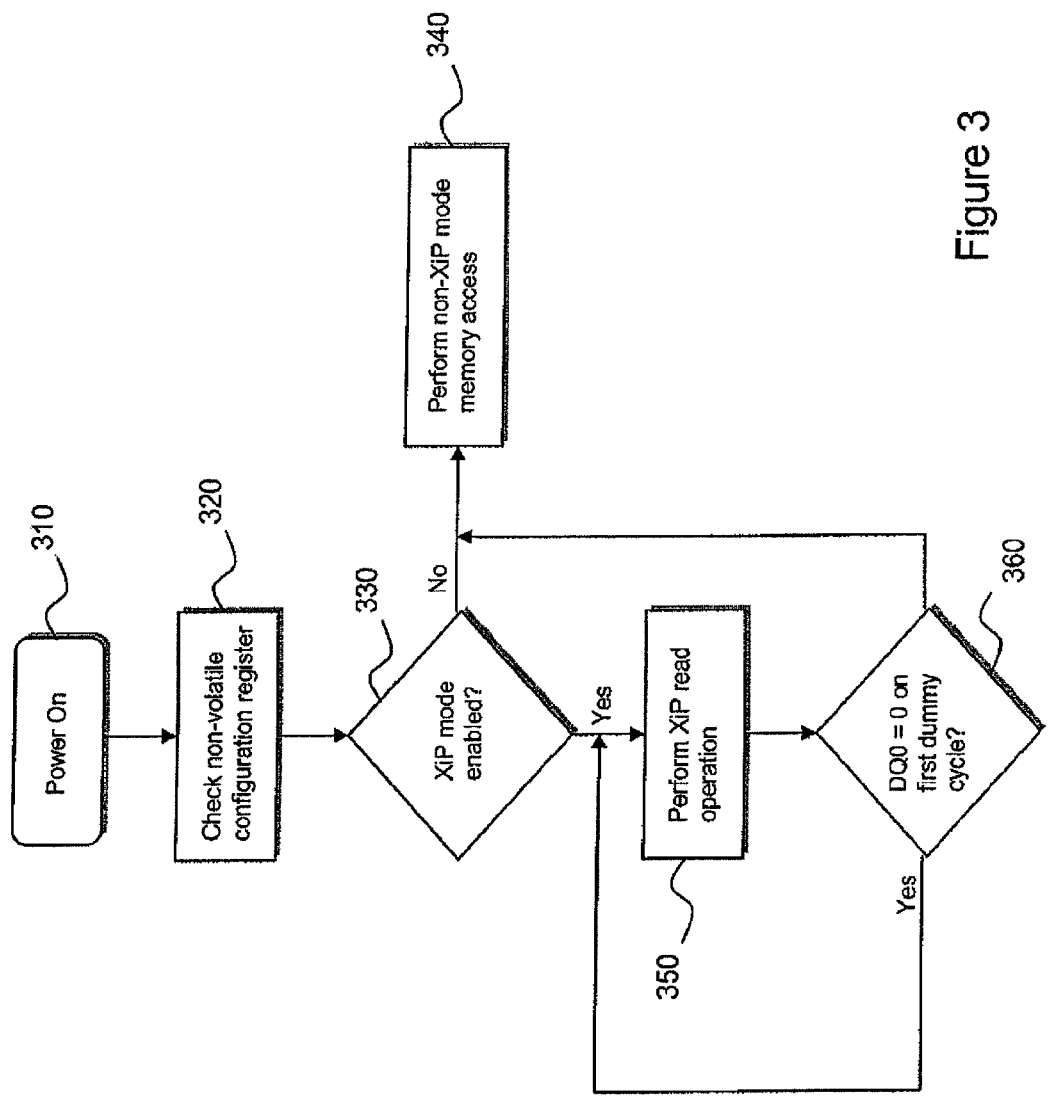
FIG. 3 is a flow diagram of an example embodiment of a method for configuring a serial flash memory device for an execute-in-place mode.

FIG. 3 is a flow diagram of an example embodiment of a method for configuring a serial flash memory device to operate in an execute-in-place (XiP) mode of operation. For one or more embodiments, and as discussed more fully below, an example XiP mode of operation may comprise beginning command sequences with an address, rather than with a command code as would be the case with a standard mode of operation, By eliminating the command code, eight clock cycles may be saved for read operations, for one or more embodiments. In this manner, processor 100 may retrieve instructions 122 from memory device 200 at an accelerated rate.

At block 310, power may be applied to serial flash memory device 200. At least in part in response to the application of power to memory device 200, a nonvolatile configuration register may be checked to determine the contents of an XiP mode field. For an embodiment, the check may be performed by a controller within memory device 200, such as control unit 122, although the scope of claimed subject matter is not limited in this respect. As depicted at block 330, if the check of the non-volatile register determines that the XiP mode field contains an indication that an XiP mode has been enabled, an XiP mode read operation may be performed at block 350. If, however, the check of the register determines that the XiP mode field contains an indication that an XiP mode is disabled, a non-XiP mode memory access operation may be performed at block 340. For one or more embodiments, an XiP mode entry value may be delivered to memory device 200 during the first dummy cycle of a read operation, as explained more fully below. For one or more example embodiments, a value of '0' on the DQ0 terminal during the first dummy cycle may signify an XiP mode entry value, and a value of '1' on the DQ0 terminal may comprise an XiP mode exit value. If it is determined at block 360 that a value of 0' is present on DQ0 during the first dummy cycle, memory device 200 may continue in the XiP mode. If a value of '1' is present during the first dummy cycle, the XiP mode may be disabled, and a non-XiP mode memory access may be performed at block 340. Of course, the above is merely an example of configuring a serial flash memory device for an XiP mode for read operations, and the scope of claimed subject matter is not limited to these specific details. For example, embodiments in accordance with claimed subject matter may include all, less than, or more than, blocks 310-360. Also, the order of blocks 310-360 is merely and example order, and the scope of claimed subject matter is not limited in this respect.

Various aspects of example embodiments related to example XiP modes for read operations are discussed below. A number of details are provided for one or more example embodiments, including tables and diagrams describing various command sequences and memory configurations. However, it should be noted that any number of other embodiments are possible using a wide range of variations from these example embodiments, and are within the scope of claimed subject matter.

As mentioned above, and as depicted in FIG. 1, serial flash memory device 200 may comprise a non-volatile configuration register 124 and a control unit 126. Configuration register 124 may be used to indicate that an XiP mode of operation has been entered. By storing the indication in a non-volatile register, memory device 200 may remember its current mode of operation even in the event of a system shutdown or reset. Memory device 200 may begin operation in the indicated XiP mode of operation upon a system restart. In this manner, there in no need for processor 100 to re-program memory device 200 to enter the XiP mode every time the system is restarted. Overall system performance may be improved, and user of the system may perceive a quicker start-up in some situations.

For one or more embodiments, a number of XiP modes of operation may be implemented in accordance with a number of different read operation types. Possible read operations, for one or more embodiments, may include but are not limited to, the number of dummy clock cycles to include in such command sequences as, for example, Read Common Flash memory interface (RCFI), Read Electronic Signature (RES), Read One-Time Programmed (ROTP), Fast Read Data Bytes (Fast Read), Dual Output Fast Read Data Bytes (DOFR), Dual I/O Fast Read Data Bytes (DIOFR), Quad Output Fast Read Data Bytes (QOFR) and Quad I/O Fast Read Data Bytes (QIOFR) commands. For an embodiment incorporating a three-bit XiP mode field in the non-volatile register, the following table provides several different possible modes for XiP operation:

TABLE 1

XiP Mode Field for Non-Volatile Configuration Register

| Value | XiP Operation |
| --- | --- |
| 000b | XiP Single I/O Fast Read Mode |
| 001b | XiP Dual Output Fast Read |
| 010b | XiP Dual I/O Fast Read |
| 011b | XiP Quad Output Fast Read |
| 100b | XiP Quad I/O Fast Read |
| 101b | reserved |
| 110b | reserved |
| 111b | XiP Disabled |

Non-Volatile configuration register 124 for an embodiment may be set through a Write to Configuration Register (WRCR) command. Also, for an embodiment, the contents of the non-volatile configuration register may be verified by way of a dedicated read operation which, for an embodiment, may comprise an eight-bit command code.

For an embodiment, non-volatile configuration register 124 may comprise flash memory cells, and may have a default value determined during the manufacturing process, for example. Also for an embodiment, the default value may comprise a value signifying an "XiP Disabled" mode, However, the scope of claimed subject matter is not limited in these respects.

As discussed above, for one or more embodiments, serial flash memory 200 may support one or more XiP modes to perform read operations without having to include a command code before the address, resulting in a reduction of eight clock cycles for at least some read command sequences. For an embodiment, the streaming mode may be available for a number of read commands, such as, for example, Fast Read, DOFR, DIOFR, QOFR, and QIOFR.

Configuration register 124 may also used to enable or disable the XiP modes, at least in part. For an embodiment, writing the XiP mode value to the configuration register by itself does not cause the memory device to perform streaming read operations. Rather, for an embodiment, the XiP mode may be entered by receiving an XiP mode entry value from the processor during a first dummy cycle of a read operation. Subsequent read operations may occur without the eight-bit command code, at least until an XiP mode exit value is received during the first dummy cycle of some subsequent read operation.

As discussed above, one technique for enhancing throughput for a serial flash memory device is to provide one or more XiP modes for data read operations. For example embodiments described herein, the XiP modes may allow computing platform 100 to perform read operations from serial flash memory 200 without needing to transmit a command code at the beginning of a command sequence. As will be seen in FIGS. 4-7, discussed below, the DQ0 value during the first dummy clock cycle of a read command sequence may be used to enter or exit the XiP mode. For an embodiment, a value of '0' on DQ0 during the first dummy clock cycle may indicate that memory 200 is to enter or continue the XiP mode. Subsequent reads may only be of the same type if no command code is provided, for an embodiment. By eliminating the command code, eight clock cycles may be saved for every read command while in streaming mode. Also for an embodiment, a '1' value on DQ0 during the first dummy clock cycle will indicate to memory 200 to exit the streaming mode, and subsequent operations may operate under normal command protocols.

Figure 4:
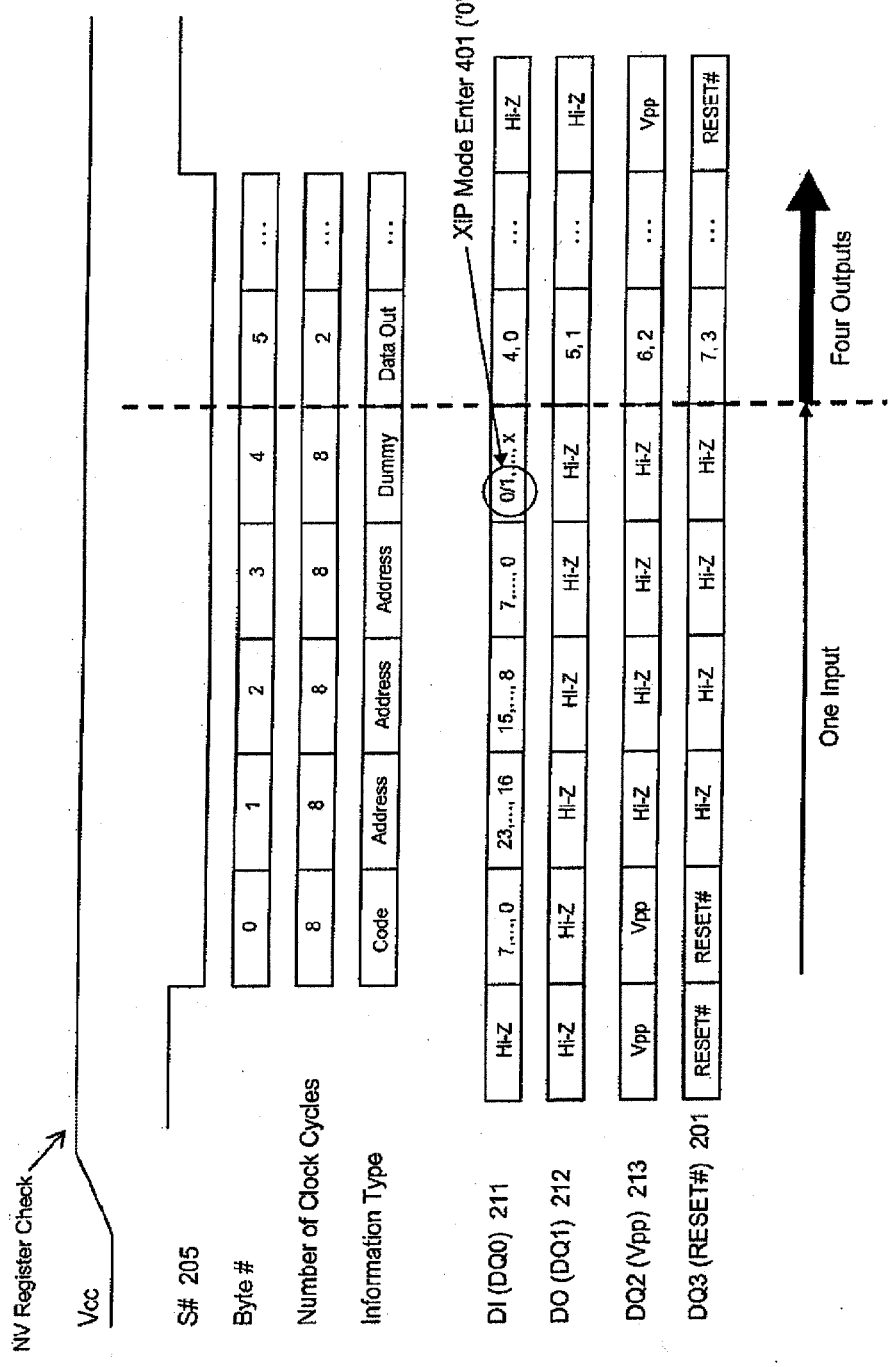
FIG. 4 is a diagram of an example embodiment of a quad output fast read operation.

FIG. 4 is a diagram of an example embodiment of a quad output fast read operation, including an entry to an XiP mode. For this example, it may be assumed that a check was made of non-volatile configuration register 124 at least in part in response to power Vcc being applied to serial flash memory device 200, For this example, the memory device is not operating in an XiP mode at power-up. At byte 0, S#205 becomes asserted by processor 110, indicating that processor 110 is acting as the master and memory 200 is acting as slave, for this example, and a command code is presented by the processor to DI 211. For this particular command sequence, there is a single input on DI 211, and there are four outputs on terminals DQ0 211, DQ1 212, DQ2 213, and DQ3 201. At bytes 1-3, an address is presented by processor 110 to DQ0 211.

For this example, at byte 4, which is the first dummy clock cycle, an XiP mode enter signal 401 with a value '0' is presented by processor 110 to terminal DQ0 211, indicating to control unit 126 that subsequent quad output fast read operations may be presented to serial flash memory 200 without a command code, as is demonstrated in FIG. 5, discussed below. Prior to this, although not shown in FIG. 4, the processor would have written an appropriate value to configuration register 124 to configure memory device 200 for XiP mode operation, and the receipt of the XiP mode enter value during the first dummy cycle causes memory device 200 to begin operating in the XiP mode, wherein memory device 200 will not expect to receive a command code from processor 110 for subsequent operations until the XiP mode is exited. For the present example of FIG. 4, data is transmitted from the four output terminals to the processor during byte 5. S#205 is deasserted by processor 110 after byte 6, indicating that the command sequence has been completed.

Figure 5:
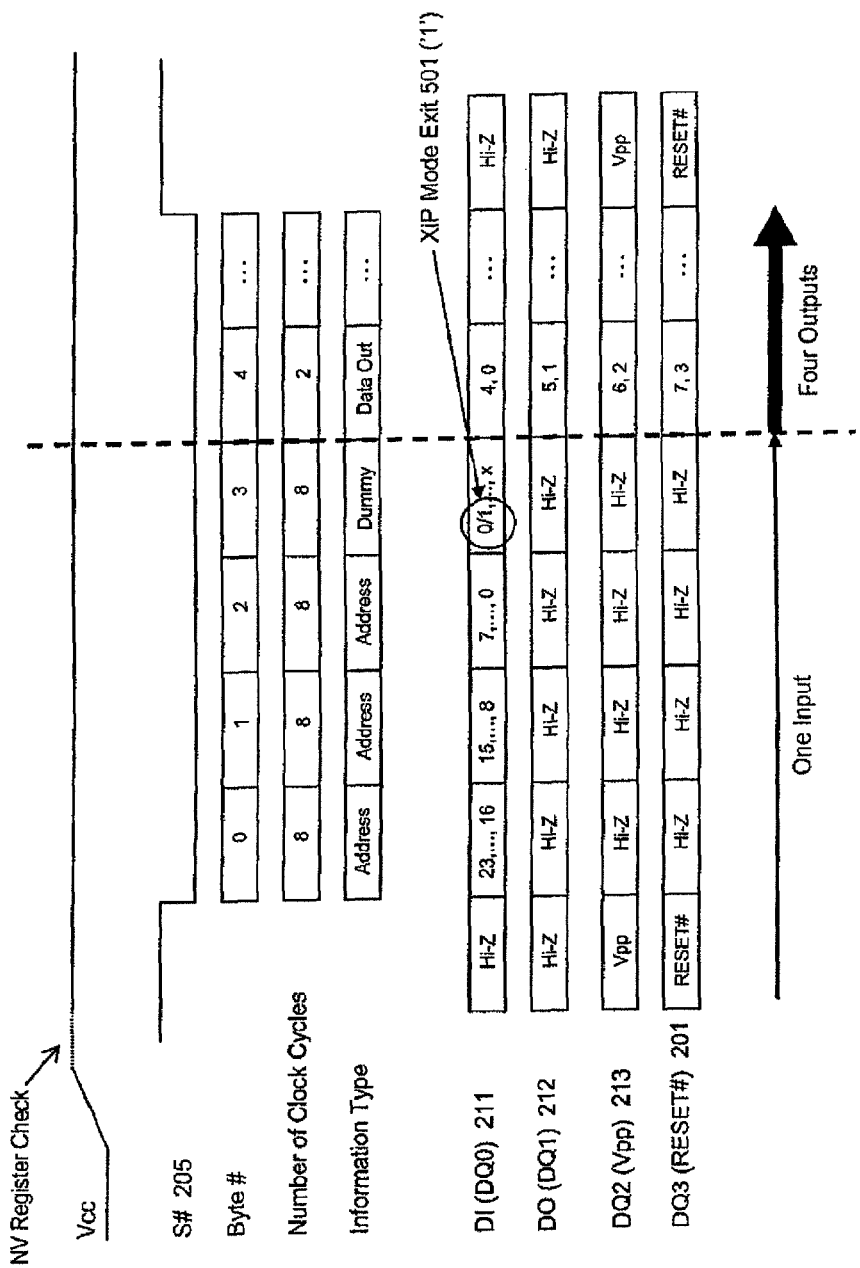
FIG. 5 is a diagram of an example embodiment of a quad output fast read operation in an example execute-in-place mode.

FIG. 5 is a diagram of an example embodiment of an XiP mode quad output fast read operation. Because this example command sequence is in an XiP mode, no command code is presented to DQ0 211 at the beginning of the sequence. Rather, the sequence begins with the address. For this example embodiment, the input information is received over a single input terminal DQ0 211, and output data is transmitted by four output terminals DQ0 211, DQ1 212, DQ2 213, and DQ3 201. FIG. 5 also depicts that if the illustrated operation is the first operation after a power-up, a check of the non-volatile configuration register occurs prior to the first command sequence. For the present example, such a check of the register may determine that the memory device was previously operating in the XiP quad output fast read mode. For an embodiment, the XiP mode field of the configuration register may contain a value of 011 b to denote the XiP quad output fast read operation.

For this example command sequence, although the sequence began with memory 200 in XiP quad output fast read mode, at byte 3, which is the first dummy clock cycle for this sequence, an XiP mode exit 501 value '1' is presented to DQ0 211 by processor 110, indicating to memory 200 that subsequent quad output fast read command sequences will not be in XiP mode, but will rather begin with a command code. At least in part in response to receiving the exit value, configuration register 124 may be reset to the default value of 111b, indicated that the XiP mode is disabled, for one or more embodiments. For other embodiments, processor 110 may write the appropriate value to configuration register 124.

Figure 6:
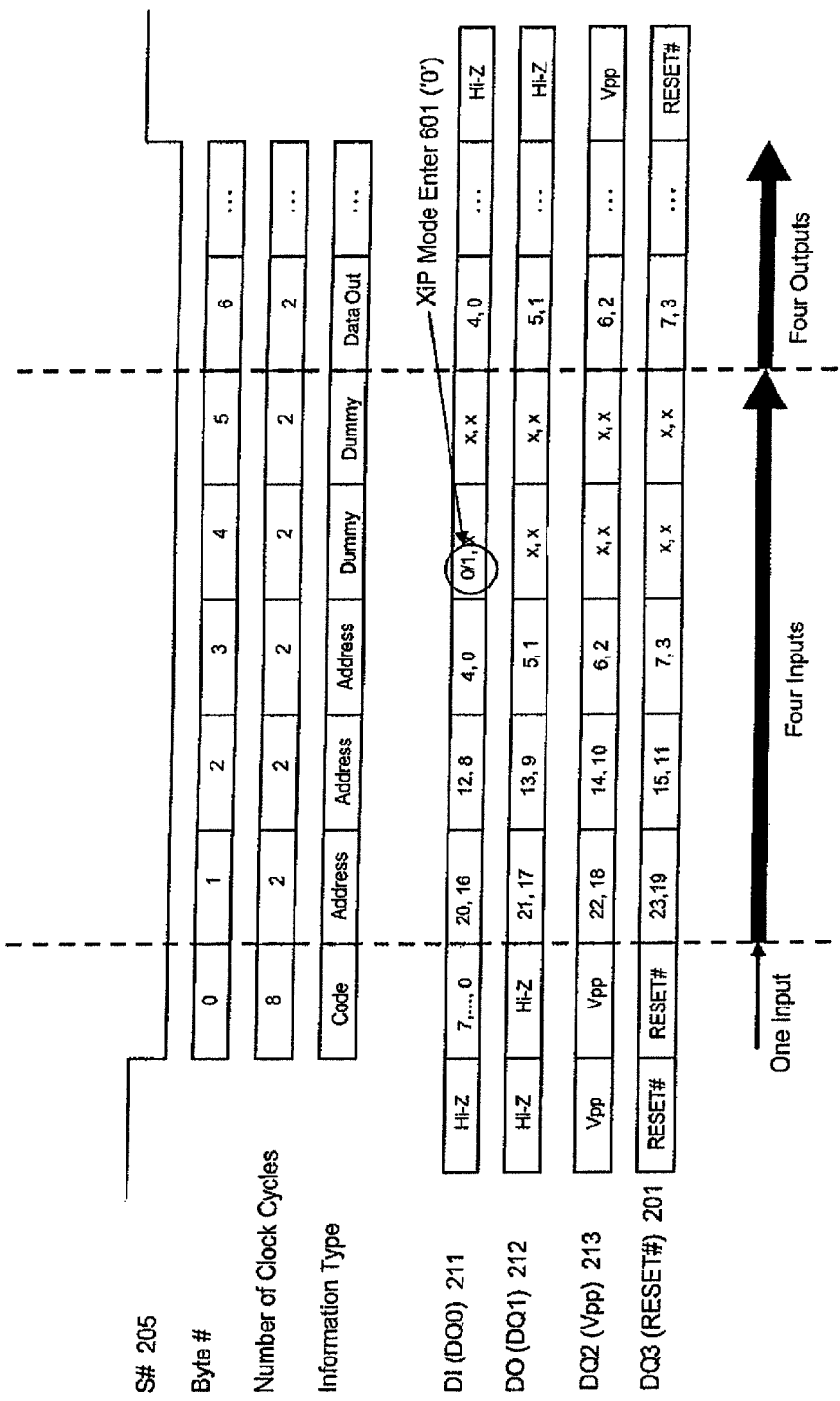
FIG. 6 is a diagram of an example embodiment of a quad input/quad output fast read operation.

FIG. 6 is a diagram of an example embodiment of a quad input/quad output fast read operation. This example also demonstrates an entry to an XiP mode, by way of XiP mode enter 601 value '0' presented by processor 110 to DQ0 211 at byte 4. At byte 0, S# becomes asserted by processor 110, indicating that processor 110 is acting as the master and memory 200 is acting as slave, for this example, and a command code is presented by the processor to D! 211. For this particular command sequence, there is a single input on DI 211, and there are four outputs on terminals DQ0 211, DQ1 212, DQ2 213, and DQ3 201. Although this example is similar to that of FIG. 4 in some ways, this example differs in that four input terminals are used to shift in the address bytes. Specifically, the address is received during bytes 1-3 at DQ0 211, DQ1 212, DQ2 213, and DQ3 201.

For this example, at byte 4, which is the first dummy clock cycle, a XiP mode enter signal 601 with a value '0' is presented by processor 110 to terminal DQ0 211, indicating to control unit 126 that subsequent quad output fast read operations may be presented to serial flash memory 200 without a command code, as is demonstrated in FIG. 7, discussed below. For the present example, processor 110 may have previously written a value of 100b to configuration register 124 to configure memory device 200 for XiP quad input/output mode. However, for an embodiment, it is not until XiP mode enter value 601 is received that the memory device begins operation in the XiP mode. For other embodiments, operations following the write operation to the configuration register may be performed in XiP mode without the need for receiving XiP mode enter signal 601. Rather, in such a situation, value 601 may comprise an XiP mode continuation signal. For the present example of FIG. 6, data is transmitted from the four output terminals to the processor during byte 6. S#205 is deasserted by processor 110 after byte 6, indicating that the command sequence has been completed.

Figure 7:
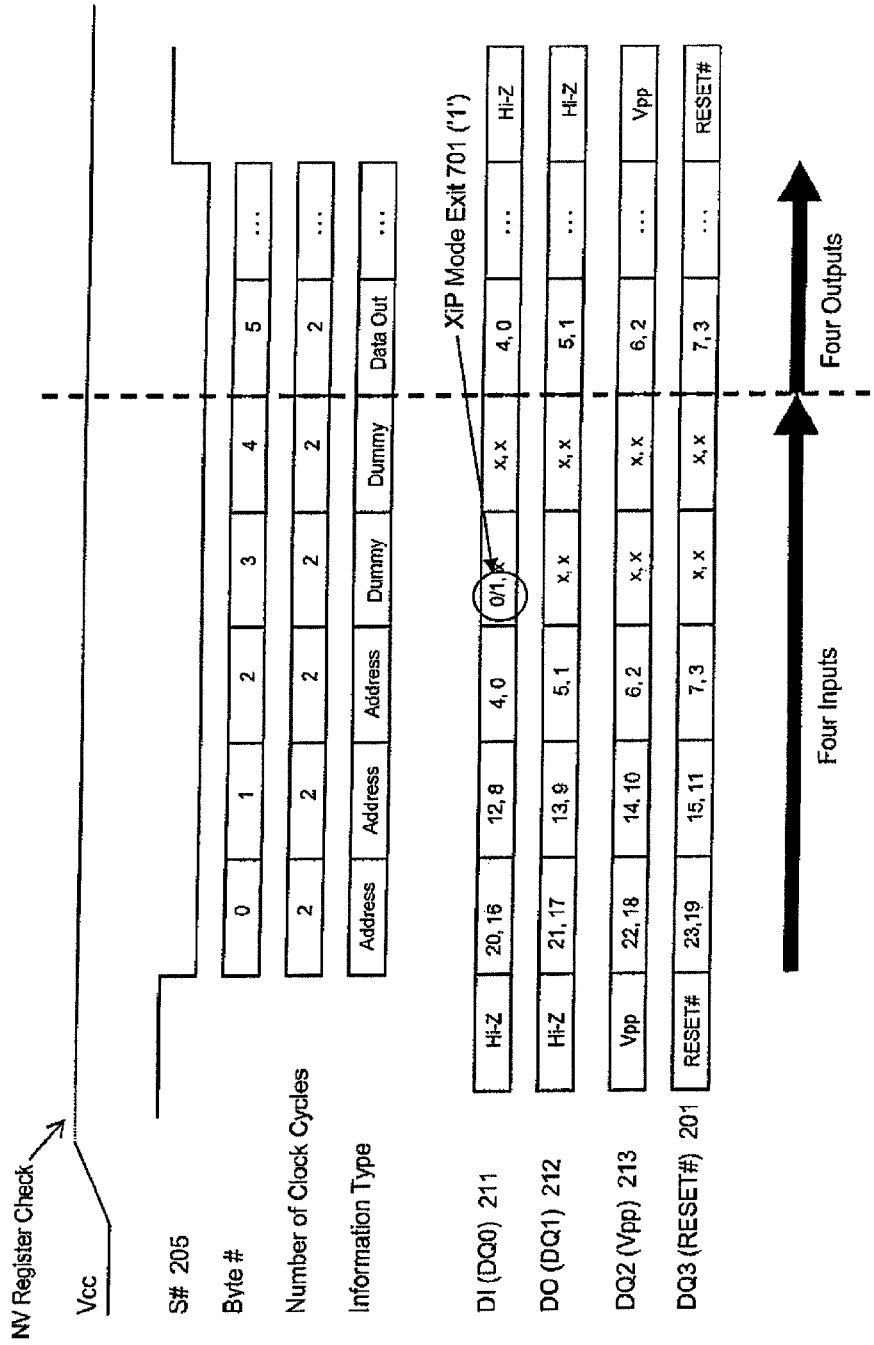
FIG. 7 is a diagram of an example embodiment of a quad input/quad output fast read operation in an example execute-in-place mode.

FIG. 7 is a diagram of an example embodiment of a quad input/quad output fast read operation in XiP mode. Because this example command sequence is in XiP mode, no command code is presented to DQ0 211 at the beginning of the sequence. Rather, the sequence begins with the address. For this example embodiment, the input information is received over a four terminals, DQ0 211, DQ1 212, DQ2 213, and DQ3 201. Output data is transmitted over the same four output terminals DQ0 211, DQ1 212, DQ2 213, and DQ3201.

For this example command sequence, although the sequence began with memory 200 in XiP mode, at byte 3, the first dummy clock cycle of four dummy clock cycles for this sequence, an XiP mode exit 701 value '1' is presented to DQ0 211 by processor 110, indicating to memory 200 that subsequent quad output fast read command sequences will not be in XiP mode, but will rather begin with a command code.

Figure 8:
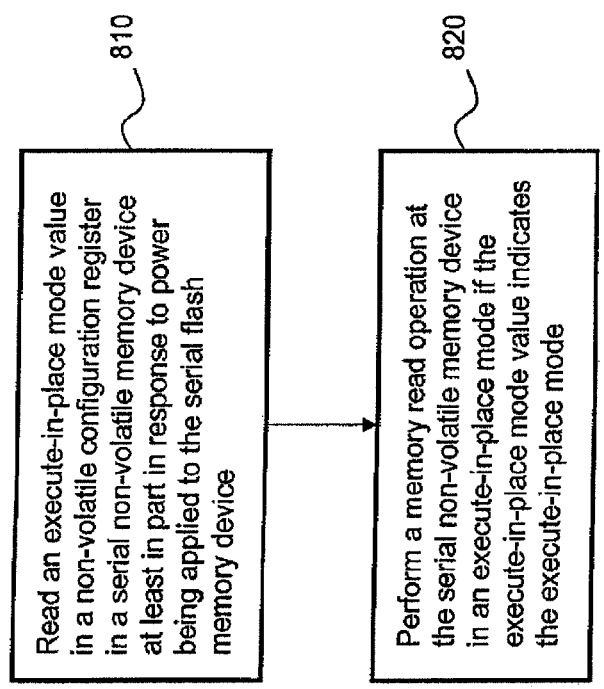
FIG. 8 is a flow diagram of an example embodiment of a method for configuring a serial flash memory device for an execute-in-place mode.

FIG. 8 is a flow diagram of an example embodiment of a method for configuring a serial non-volatile memory device for XiP mode operation. At block 810, an execute-in-place mode value may be read from a non-volatile configuration register in the serial non-volatile memory device at least in part in response to power being applied to the serial flash memory device. At block 820, a memory read operation is performed at the serial non-volatile memory device in an execute-in-place mode if the execute-in-place mode value indicates the execute-in-place mode. Embodiments in accordance with claimed subject matter may include all, less than, or more than blocks 810-820. Also, the order of blocks 810-820 is merely an example order, and the scope of claimed subject matter is not limited in this respect.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. An apparatus comprising a serial non-volatile memory device, the apparatus comprising:
    a non-volatile configuration register configured to store a value; and
    a control unit configured:
        to read the value upon power up of the serial non-volatile memory device;
        to determine whether or not to enter a selected execute-in-place (XiP) mode based on the value; and
        when in the selected XiP mode, to receive command sequences beginning with an address.

2. The apparatus of claim 1, wherein the control unit is further configured to perform a memory read operation in a non-XiP mode when the value stored in the configuration register indicates other than an XiP mode.

3. The apparatus of claim 1, further comprising an input/output (I/O) terminal, the I/O terminal configured to receive the value for the configuration register from a processor.

4. The apparatus of claim 3, wherein the value for the configuration register indicates one of an XiP single I/O fast read mode, an XiP dual output fast read mode, an XiP dual I/O fast read mode, an XiP quad output fast read mode, an XiP quad I/O fast read mode, or an XiP disabled mode.

5. The apparatus of claim 4, wherein the control unit is further configured to enter the XiP mode at least in part in response to the I/O terminal receiving an XiP mode entry command during a first dummy cycle of a subsequent read command sequence.

6. The apparatus of claim 1, wherein the serial non-volatile memory device comprises a serial flash memory device.

7. The apparatus of claim 6, wherein the control unit is further configured to perform a memory read operation in the XiP mode by receiving at least a part of the address during a first byte period of the memory read operation at an input/output (I/O) terminal of the serial flash memory device, and the control unit is further configured to exit the XiP mode at least in part in response to receiving an XiP mode exit value at the I/O terminal during a first dummy cycle of the memory read operation.

8. The apparatus of claim 7, wherein the control unit is further configured to update the non-volatile configuration register with a new value to correspond to an XiP disabled mode at least in part in response to exiting the XiP mode.

9. An electronically-implemented method of accessing a serial non-volatile memory device, the method comprising:
   reading a value stored in a non-volatile configuration register of the serial non-volatile memory device upon power up of the serial non-volatile memory device; and
   determining whether or not to enter a selected execute-in-place (XiP) mode based on the value; and
   when in the selected XiP mode, receiving command sequences beginning with an address.

10. The method of claim 9, further comprising performing a memory read operation in a non-XiP mode when the value stored in the configuration register indicates other than an XiP mode.

11. The method of claim 9, further comprising receiving the value for the configuration register from a processor via an input/output (I/O) terminal.

12. The method of claim 11, wherein the value for the configuration register indicates one of an XiP single I/O fast read mode, an XiP dual output fast read mode, an XiP dual I/O fast read mode, an XiP quad output fast read mode, an XiP quad I/O fast read mode, or an XiP disabled mode.

13. The method of claim 12, further comprising entering the XiP mode at least in part in response to the I/O terminal receiving an XiP mode entry command during a first dummy cycle of a subsequent read command sequence.

14. The method of claim 9, wherein the serial non-volatile memory device comprises a serial flash memory device.

15. The method of claim 14, further comprising:
   performing a memory read operation in the XiP mode by receiving at least a part of the address during a first byte period of the memory read operation at an input/output (I/O) terminal of the serial flash memory device; and
   exiting the XiP mode at least in part in response to receiving an XiP mode exit value at the I/O terminal during a first dummy cycle of the memory read operation.

16. The method of claim 15, further comprising updating the non-volatile configuration register with a new value that corresponds to an XiP disabled mode at least in part in response to exiting the XiP mode.

17. A system comprising:
   a processor, and
   a serial non-volatile memory device coupled to the processor, the serial non-volatile memory device comprising:
      a non-volatile configuration register configured to store a value; and
      a control unit configured:
         to read the value upon power up of the serial non-volatile memory device;
         to determine whether or not to enter a selected execute-in-place (XiP) mode based on the value; and
         when in the selected XiP mode, to receive command sequences beginning with an address.

18. The system of claim 17, wherein the control unit is further configured to perform a memory read operation in a non-XiP mode when the value stored in the configuration register indicates other than an XiP mode.

19. The system of claim 17, further comprising an input/output (I/O) terminal, the I/O terminal configured to receive the value for the configuration register from a processor.

20. The system of claim 17, wherein the serial non-volatile memory device comprises a serial flash memory device.

* * * * *